United States Patent [19]

Onozawa et al.

[11] Patent Number: 5,019,754
[45] Date of Patent: May 28, 1991

[54] HORIZONTAL DEFLECTION CIRCUIT

[75] Inventors: Makoto Onozawa, Yokohama; Michitaka Ohsawa, Fujisawa; Katsuhiko Tonami, Chigasaki, all of Japan

[73] Assignees: Hitachi Video Engineering, Inc.; Hitachi, Ltd., Tokyo, Japan

[21] Appl. No.: 413,456

[22] Filed: Sep. 27, 1989

[30] Foreign Application Priority Data

Sep. 29, 1988 [JP] Japan .................................. 63-242448

[51] Int. Cl.$^5$ .............................................. G09G 1/04
[52] U.S. Cl. .................................................. 315/408
[58] Field of Search ........................ 315/408, 364, 403

[56] References Cited

U.S. PATENT DOCUMENTS 3,466,496 9/1969 Geller et al. ........................ 315/403
4,612,451 9/1986 Maekawa et al. .

FOREIGN PATENT DOCUMENTS 6035308 6/1980 Japan .

Primary Examiner—Gregory C. Issing
Attorney, Agent, or Firm—Fay, Sharpe, Beall, Fagan, Minnich & McKee

[57] ABSTRACT

A horizontal deflection circuit comprising a horizontal output transistor, and a drive circuit is connected between the base and the emitter of the horizontal output transistor to supply a base drive voltage to the horizontal output transistor in order to control the conduction between the collector and the emitter of the horizonal output transistor, wherein first and second switching means are provided in parallel between the base of the horizontal output transistor and the drive circuit (or between the emitter of the horizontal output transistor and the drive circuit), the first switching means permitting only the current to flow from the base of the horizontal output transistor to the drive circuit (or from the drive circuit to the emitter of the horizontal outut transistor) and the second switching means being conductive only during the conductive period of the horizontal output transistor.

5 Claims, 6 Drawing Sheets

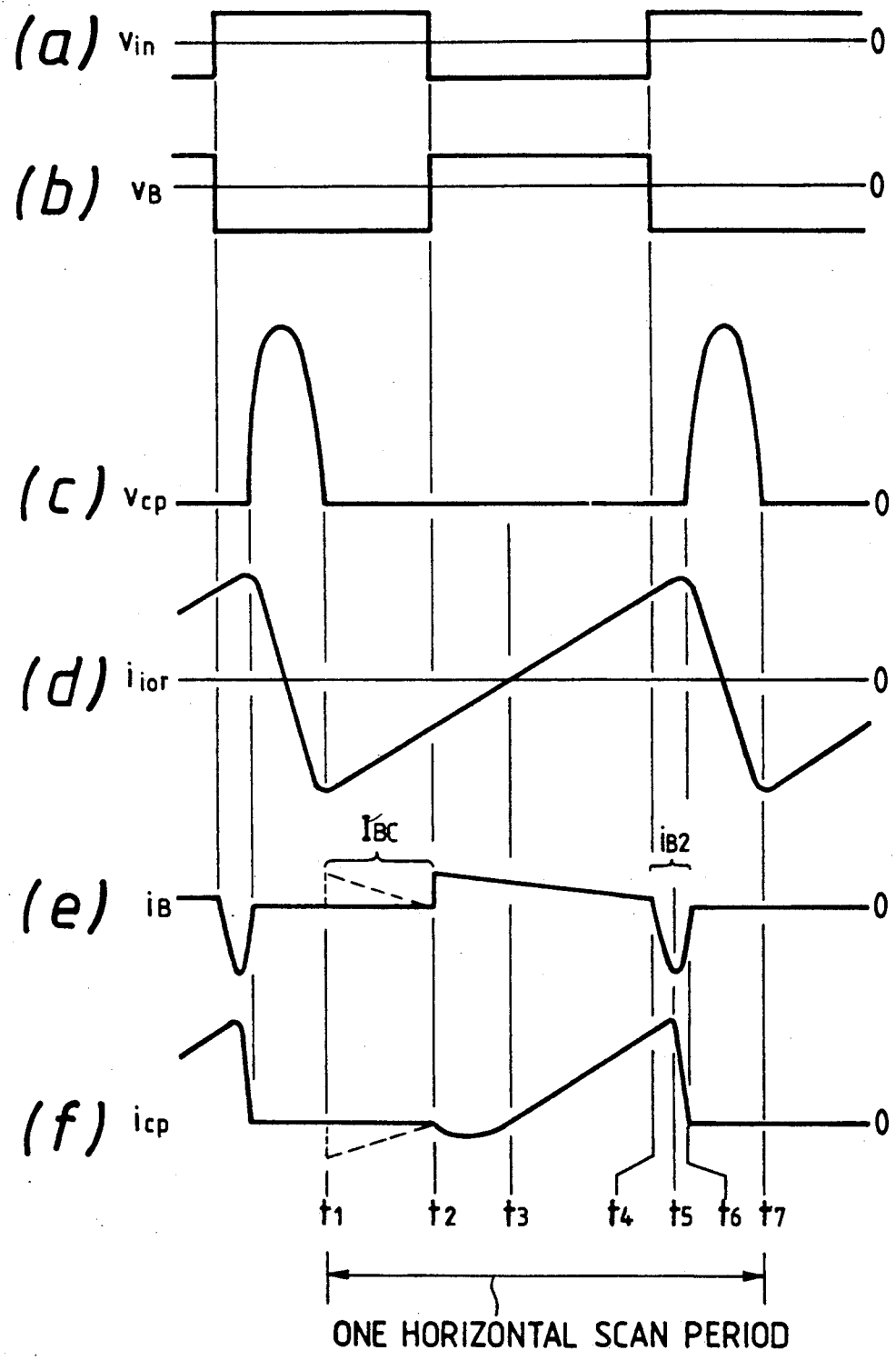

HORIZONTAL DEFLECTION CIRCUIT

SPECIFICATION

1. Field of the Invention

The present invention relates to a horizontal deflection circuit for a cathode-ray tube, and more specifically to a horizontal deflection circuit for a display for a computer terminal in which a horizontal deflection frequency is set to be higher than that of an ordinary television receiver.

2. Background of the Invention

It has been urged to provide a CRT display device having a higher resolution so that it can display increased amounts of data simultaneously in a computer terminal. In order to realize the display device having such a high resolution, it is necessary to carry out the horizontal deflection operation at high speeds maintaining large outputs (i.e., at a high horizontal scan frequency while flowing a large horizontal deflection current into the horizontal deflection coil).

U.S. Pat. No. 4,612,451 discloses an example in which the horizontal output transistor effects the switching operation at high speeds in order to increase the speed of horizontal deflection operation. In this example, the taps of the secondary winding of a horizontal drive transformer that gives a base bias for the horizontal output transistor are switched by the two diodes that are connected to the secondary winding, such that the base bias in the reverse direction becomes greater than the base bias in the forward direction. Since a large reverse bias is given to the base, the storage charge that builds up while the horizontal output transistor is conductive vanishes quickly, and the transit time from a conductive status to a cut-off status is shortened.

According to the above conventional horizontal deflection circuit in which a series circuit is constituted by the secondary winding of the drive transformer and the base-collector junction of the horizontal output transistor in parallel with the damper diode, however, a damper current that should flow into the damper diode also branches into this series circuit. This branch current increases the storage charge which impairs the horizontal deflection from operating at high speeds. In order to use the horizontal output transistor at a high horizontal deflection frequency (e.g., at 128 KHz) maintaining reliability, furthermore, the power loss of the transistor must be suppressed as much as possible. Here, however, the branch current generates a loss $P_{BC}$ given by the product of a base-collector current $I_{BC}$ and a base-collector voltage $V_{BC}$, and further causes the switching loss $P_{SW}$ to increase accompanying the storage time. In order to prevent the switching transistor from generating the base-collector current $I_{BC}$, a stopper diode should be inserted in the collector current path as disclosed in Japanese Utility Model Publication No. 35308/1985. In fact, however, a deflection current of a large amplitude flows into the stopper diode and whereby a large loss generates in the stopper diode itself. Moreover, the resistance component during the on time deteriorates the linearity in the deflection current waveform. Because of these reasons, therefore, the prevention method disclosed in Japanese Utility Model Publication No. 35308/1985 cannot be adapted to the horizontal deflection circuit.

SUMMARY OF THE INVENTION

The object of the present invention is to provide a horizontal deflection circuit which shortens the storage time of the horizontal output transistor.

Another object of the present invention is to provide a horizontal deflection circuit which decreases the loss of the horizontal output transistor.

In order to achieve the above objects, the present invention provides a horizontal deflection circuit comprising a horizontal drive circuit for generating horizontal drive signals that alternatingly repeats a first period and a second period in a horizontal period, a horizontal output transistor that forms a path through which a horizontal deflection current flows together with a damper diode, a first bias means which gives a reverse bias to the base of a horizontal output transistor during a first period of the horizontal drive signal, and a second bias means that includes a switch which is shut off during the first period of the horizontal drive signal and which becomes conductive during the second period, such that the forward bias is given to the base of the horizontal output transistor via the switch during the second period.

BRIEF DESCRIPTION OF THE DRAWINGS

FIGS. 2a-f are diagrams showing voltage or current waveforms at principal portions in the horizontal deflection circuit of FIG. 1;

DESCRIPTION OF THE PREFERRED EMBODIMENTS

Figure 1:
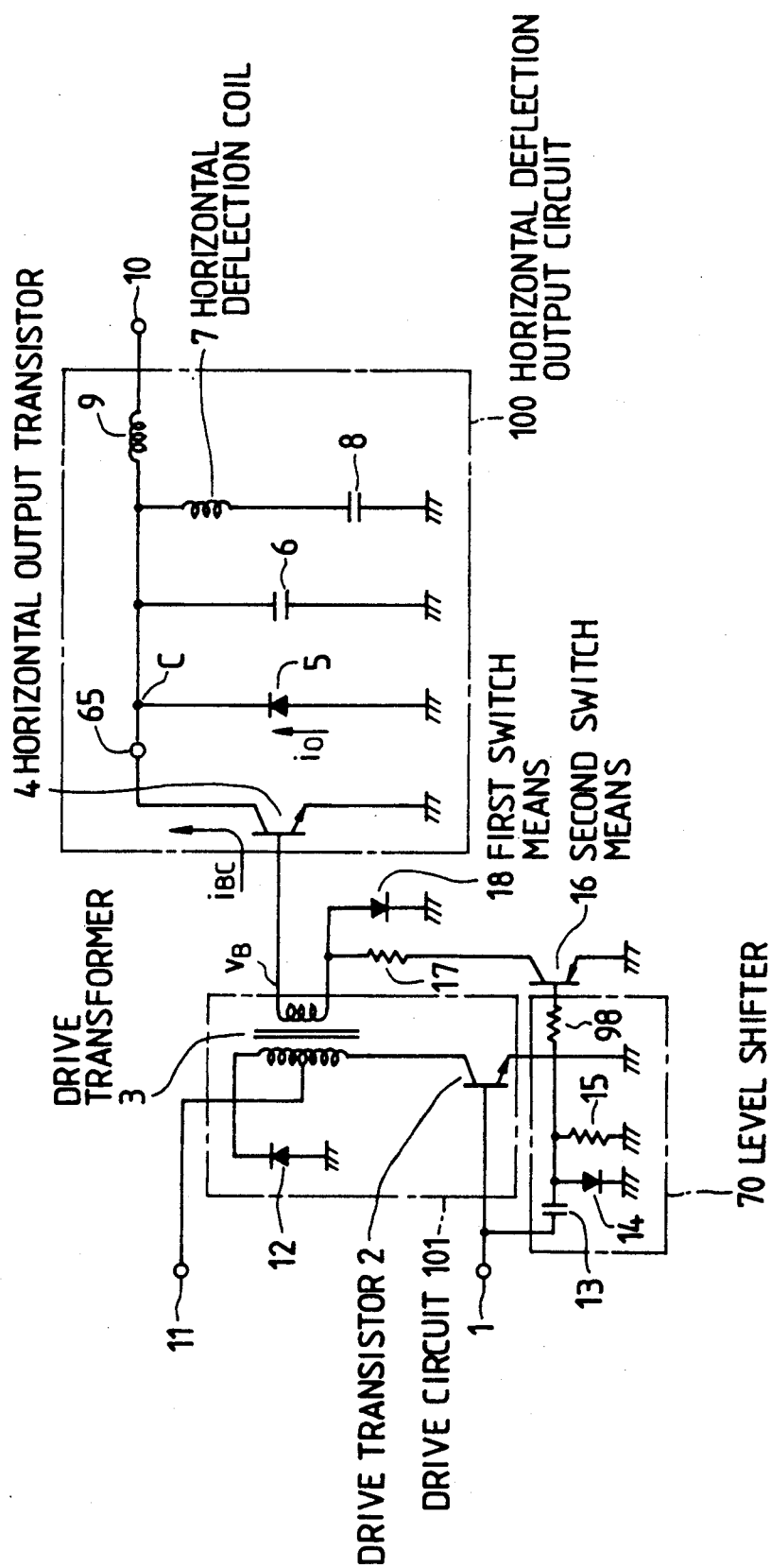
FIG. 1 is a diagram illustrating a horizontal deflection circuit according to an embodiment of the present invention.

In FIG. 1, reference numeral 1 denotes a drive pulse input terminal, 2 denotes a drive transistor, 3 denotes a drive transformer, 4 denotes a horizontal output transistor, 5 denotes a damper diode, 6 denotes a resonance capacitor, 7 denotes a horizontal deflection coil, 8 denotes a scan capacitor, 9 denotes a choke coil, 10 denotes a power source voltage input terminal, 11 denotes a drive voltage input terminal, 12 and 14 denote diodes, 13 denotes a capacitor, 15 and 98 denote resistors, 16 denotes a transistor, 17 denotes a resistor for regulating the base current, 18 denotes a diode.

In FIG. 1, a horizontal deflection output circuit 100 is constituted by the horizontal output transistor 4, damper diode 5, resonance capacitor 6, horizontal deflection coil 7, scan capacitor 8, and choke coil 9. Further, a drive circuit 101 is constituted by the drive transistor 2, drive transformer 3, and diode 12. The drive circuit 101 is the one of a generally called fly-wheel type which is capable of removing ringing that generates on the collector of the drive transistor 2 owing to the function of the diode 12.

The resistor 17 for regulating the base current works to regulate the forward base current $i_{B1}$ (FIG. 2(e), current $i_B$ between $t_2$ and $t_4$) of the horizontal output transistor 4, and the diode 18 works to forcibly remove the storage charge of the horizontal output transistor 4 as a reverse base current $i_{B2}$ (FIG. 2(c)) irrespective of the value of the resistor 17.

A level shifter 70 is constituted by a capacitor 13, a diode 14, and resistors 15 and 98.

FIGS. 2(a) to 2(f) illustrate voltage or current waveforms at principal portions in FIG. 1, and wherein FIG. 2(a) shows a voltage waveform of drive signals supplied to the terminal 1, FIG. 2(b) shows a waveform of a base drive voltage supplied to the base of the output transistor 4, FIG. 2(c) shows a waveform of a collector voltage of the output transistor 4, FIG. 2(d) shows a waveform of a horizontal deflection current, FIG. 2(e) shows a waveform of a base current of the output transistor 4, and FIG. 2(f) shows a waveform of a collector current of the output transistor 4.

The output transistor 4 is so biased as to assume the cut-off status when the base voltage $v_B$ (FIG. 2(b)) of the output transistor 4 falls (time $t_4$). Due to the discharge of storage charge at the time when the output transistor 4 is rendered conductive, however, there develops a delay time ($t_6-t_4$) and a moment of when the cut-off status is really assumed is shifted to a time $t_6$. The horizontal deflection current $i_{DY}$ (FIG. 2(d)) is inverted as the output transistor 4 is cut off, and a fly-back pulse $v_{cp}$ (FIG. 2(c)) generates. After the completion of the fly-back pulse $v_{cp}$ (time $t_1$, $t_7$), a damper current flows through the damper diode 5 during a period $t_1-t_2$. If there exists a DC conduction path between the base of the output transistor 4 and the ground during this period the output transistor 4 is rendered conductive as a reverse transistor and undesired current (i.e., branch current of damper current) generates as indicated by broken lines in FIGS. 2(e) and 2(f). In this embodiment, however, the transistor 16 is in the off status during the period in which the drive signal $v_{in}$ (FIG. 2(a)) is positive inclusive of the period $t_1-t_2$, and there is formed no branch path through which the above undesired current flows. Accordingly, the above-mentioned undesired current does not generate.

Here, a collector current in the negative direction generates during the period $t_2-t_3$ which is provided as a margin period because of the reasons described below. If the time at which the damper diode 5 is cut off is not in agreement with the time at which the output transistor 4 becomes conductive and if there exists a blank time between these two times due to variance in the elements, then a path through which a deflection current flows is cut off and the deflection current becomes discrete. Therefore, the time at which the output transistor 4 becomes conductive is set to be earlier than the time at which the damper diode 5 is cut off, in order to maintain the path through which the deflection current flows even in case the two times are not in agreement with each other. That is, the deflection current flows through both the output transistor 4 and the damper diode 5 during the period $t_2-t_3$.

Figure 3A:
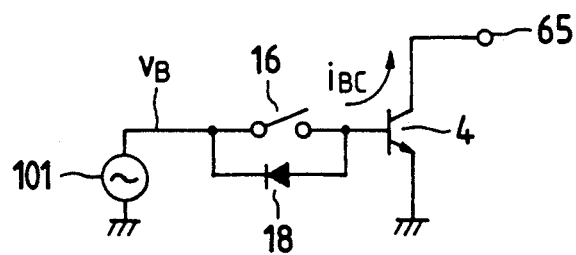
FIGS. 3a-d are circuit diagrams illustrating fundamental constitutions according to the present invention.

FIG. 3(a) is a diagram showing a fundamental constitution of the present invention.

In FIG. 3(a), reference numeral 18' denotes a first switching means (which is constituted by using a unidirectional switching element such as a diode 18), and 16' denotes a second switching means (which is constituted by using switching elements with a control terminal such as a transistor 16 and a gate turn-off thyristor (GTO)).

In FIG. 3(a), the drive circuit 101 produces a base drive voltage $V_B$ that is shown in FIG. 2(b). The base drive voltage $V_B$ exhibits a rectangular waveform having a voltage of about 3 V (hereinafter referred to as the "H" level) during a period of from time $t_2$ to time $t_4$ and a voltage of about $-3$ V (hereinafter referred to as the "L" level) during a period of from time $t_4$ to time $t_2$ of a next cycle.

The horizontal output transistor 4 performs the switching operation based on the base drive voltage $V_B$, and wherein a path between the collector and the emitter becomes conductive when the base drive voltage $V_B$ has the "H" level and becomes nonconductive when the base drive voltage $V_B$ has the "L" level.

The first switching means 18' permits only the current that flows from the base of the horizontal output transistor 4 to the drive circuit 101.

The second switching means 16' becomes conductive only during the conductive period of the horizontal output transistor 4 (i.e., during the period in which the base drive voltage $V_B$ has the "H" level), and becomes nonconductive in other periods.

As indicated by broken lines in FIGS. 2(e) and 2(f), on the other hand, the base-collector current may flow (i.e., the current $i_{BC}$ may flow through the diode between the base and the collector of the horizontal output transistor 4) as a branch current of the damper current during a period of from time $t_1$ to time $t_2$.

According to the circuit shown in FIG. 3(a) therefore, the second switching means 16' interrupts the flow of current from the drive circuit 101 to the base of the horizontal output transistor 4 during the nonconductive period of the horizontal output transistor 4 (i.e., during the period in which the base drive voltage $V_B$ has the "L" level inclusive of the period of from time $t_1$ to time $t_2$), in order to block the base-collector current $i_{BC}$. Here, no current flows from the drive circuit 101 to the base of the horizontal output transistor 4 via the first switching means 18'.

Therefore, the circuit of FIG. 3(a) decreases the loss of horizontal output transistor 4 caused by the base-collector current $i_{BC}$.

Even when the second switching means 16' remains nonconductive during the period in which the horizontal output transistor 4 is nonconductive, the current (reverse base current $i_{B2}$ shown in FIG. 2(e)) continues to flow from the base of the horizontal output transistor 4 to the drive circuit 101 via the first switching means 18'.

Figure 3B:
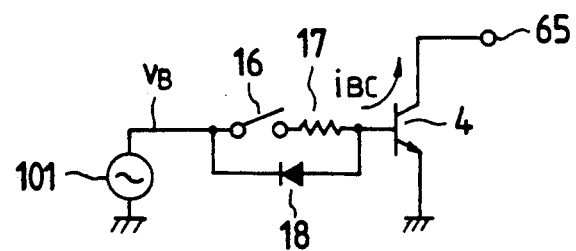

FIG. 3(b) is a diagram showing the circuit of FIG. 3(a) according to a modified example.

The circuit of FIG. 3(b) is different from the circuit of FIG. 3(a) with respect to the provision of a resistor 17 for regulating the base current. The circuit of FIG. 3(b) is capable of regulating the forward base current owing to the resistor 17 for regulating the base current. The action and effects are the same as those of the circuit shown in FIG. 3(a).

Figure 3C:
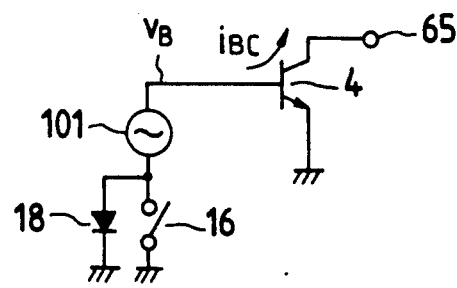

FIG. 3(c) is a circuit diagram illustrating another fundamental constitution.

In the circuit shown in FIG. 3(c), a portion for connecting the first switching means 18' and the second switching means 16' is different from that of FIG. 3(a), but the action and effects are the same as those of the circuit of FIG. 3(a).

Figure 3D:
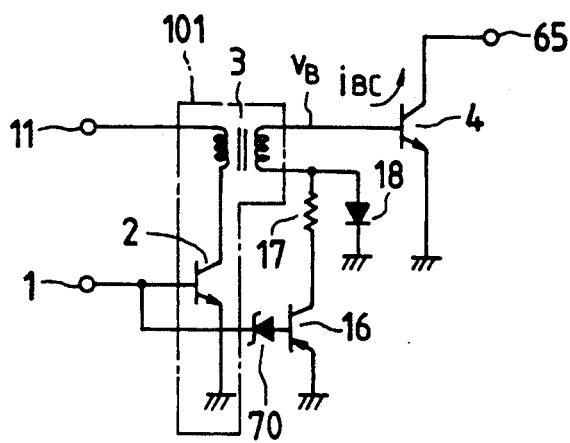

FIG. 3(d) is a diagram which concretely illustrates the circuit of FIG. 3(c).

In FIG. 3(d), reference numeral 3' denotes a drive transformer and 70' denotes a level shifter.

The second switching means (which consists of a transistor in this case) 16' receives, via the level shifter 70′, the drive pulse that is input from the drive pulse input terminal 1. The second switching means 16′ is controlled by the drive pulse so as to become conductive only during the period in which the horizontal output transistor 4 is conductive.

Since the base-collector current $i_{BC}$ of the horizontal output transistor 4 is blocked as described above, the storage charge of the horizontal output transistor 4 can be decreased and the loss can be decreased, too. Since no stopper diode is used, furthermore, there is no loss inherent in the stopper diode, and the waveform of the horizontal deflection current does not lose linearity.

Figure 4:
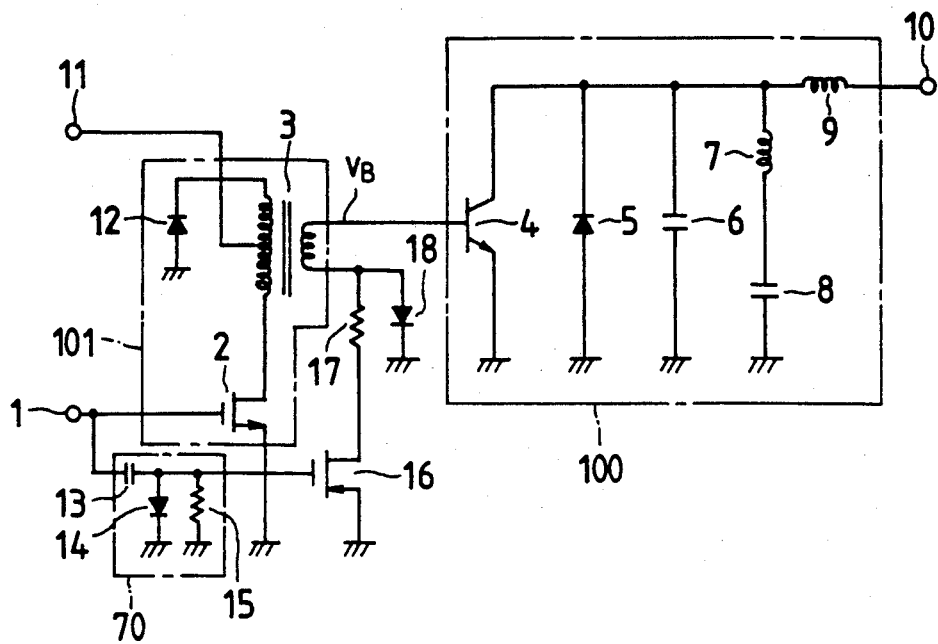
FIGS. 4 to 6 and 8 are circuit diagrams illustrating other embodiments of the present invention.

FIG. 4 is a circuit diagram illustrating a second embodiment of the present invention.

The feature of this embodiment resides in the use of power MOSFET's as the transistors 2 and 16 of FIG. 1.

The power MOSFET features high-speed switching performance which makes this embodiment adapted to the cases of high horizontal scan frequencies.

The fundamental action and effects of this embodiment are the same as those of the aforementioned first embodiment.

Power MOSFET's are used as the transistors 2 and 16 in the following embodiments. However, the fundamental action and effects are the same even when bipolar transistors and GTO's are used.

Figure 5:
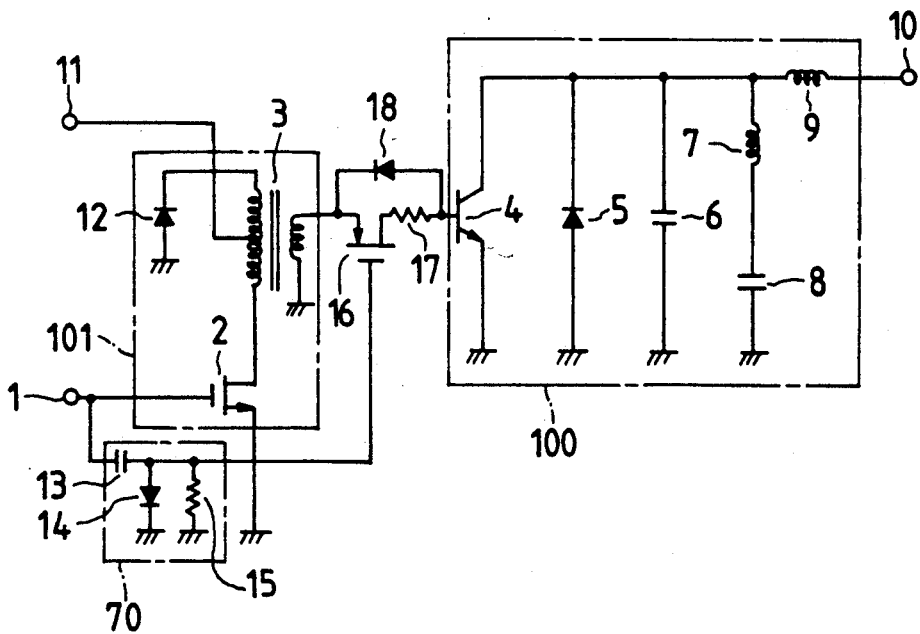

FIG. 5 is a circuit diagram illustrating a third embodiment of the present invention.

This embodiment deals with the circuit which concretely realizes the fundamental constitution of FIG. 3(b).

In this embodiment, the connection of the first switching means 18′, second switching means 16′, and resistor 17 for regulating base current is different from that of the aforementioned first embodiment or the second embodiment, but the fundamental action and effects are the same.

In order that the second switching means 16′ constituted by the power MOSFET becomes fully conductive when the output voltage on the secondary side of the drive transformer 3 has the "H" level (about 3 V), the gate voltage of the power MOSFET (p-channel type) should be lowered to about −10 V. This is, the waveform shown in FIG. 2(a) should be shifted by the level shifter 70 toward the negative side by a predetermined voltage.

Figure 6:
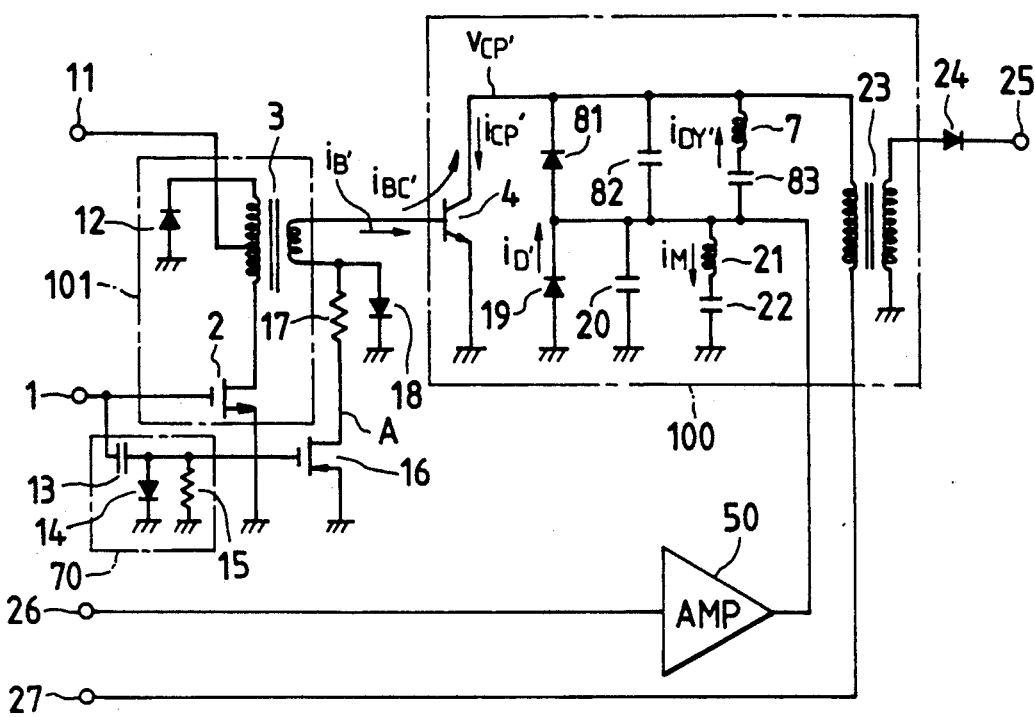

FIG. 6 is a circuit diagram illustrating a fourth embodiment of the present invention.

In FIG. 6, reference numeral 81 denotes a first damper diode, 19 denotes a second damper diode, 82 denotes a first resonance capacitor, 20 denotes a second resonance capacitor, 83 denotes a first trace capacitor, 21 denotes a modulation coil, 22 denotes a second trace capacitor, 23 denotes a fly-back transformer, 24 denotes a diode, 25 denotes a high-voltage output terminal, 26 denotes a vertical parabolic wave input terminal, 27 denotes a power source voltage input terminal, and 50 denotes an amplifier circuit. Furthermore, $v_{CP}'$ denotes a collector voltage of the horizontal output transistor 4, $i_{DY}'$ denotes a horizontal deflection current, $i_B'$ denotes a base current of the horizontal output transistor 4, $i_{CP}'$ denotes a collector current of the horizontal output transistor 4, and $i_M$ denotes a modulation current that flows into the modulation coil 21.

In FIG. 6, the horizontal deflection output circuit 100 is usually called a diode modulator and is constituted by the horizontal output transistor 4, first damper diode 81, second damper diode 19, first resonance capacitor 82, second resonance capacitor 20, horizontal deflection coil 7, first trace capacitor 83, modulation coil 21, second trace capacitor 22, and fly-back transformer 23.

In the diode modulator, parabolic wave signals of a vertical scan period are applied to one terminal (upper terminal in this embodiment) of the modulation coil 21 from the vertical parabolic wave input terminal 26 via the amplifier 50, and the horizontal deflection current $i_{DY}'$ is changed in a parabolic manner of the vertical scan period, in order to effect the side pin correction.

When the diode modulator is used as the horizontal deflection output circuit 100 as in this embodiment, distinguished effects are exhibited as in the aforementioned first embodiment, second embodiment and third embodiment compared with when the diode modulator is not used. The reasons will now be described.

In FIG. 6, the modulation current $i_M$ that flows into the modulation coil 21 returns to the modulation coil 21 via the second trace capacitor 22, second damper diode 19, first damper diode 81, horizontal deflection coil 7, and first trace capacitor 83.

When there is no transistor 16 (when the point A is grounded in FIG. 7), the modulation current $i_M$ flows through the above-mentioned path and further flows in parallel with the first damper diode 81 and the second damper diode 19 via the secondary winding of the drive transformer 3, resistor 17 for regulating the base current, and the diode between the base and the collector of the horizontal output transistor 4.

Here, symbol $i_{BC}'$ denotes a current (hereinafter referred to as base-collector current) that flows through the secondary winding of the drive transformer, resistor 17 for regulating base current, and diode between the base and the collector of the horizontal output transistor 4, and $i_D'$ denotes a damper current that flows through the second damper diode 19 and the first damper diode 81. Here, the ratio of the base-collector current $i_{BC}'$ to the damper current $i_D'$ is determined by the ratio of impedances of the two current paths.

When the amplitude of the horizontal deflection current $i_{DY}'$ is decreased to decrease the size of the horizontal raster, there arises a problem in that the base-collector current $i_{BC}'$ increases.

Figure 7:
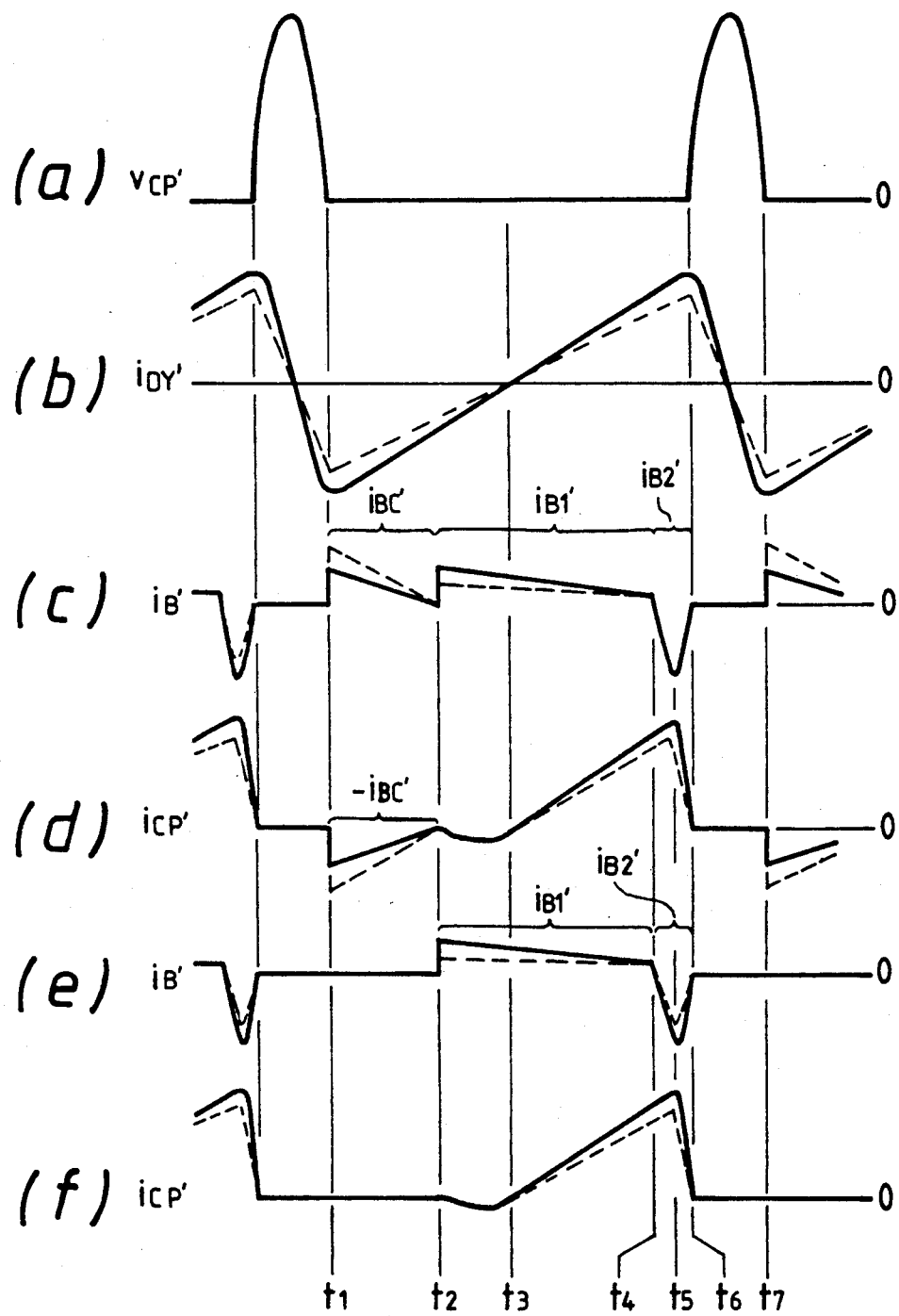
FIGS. 7a-f are diagrams showing voltage or current waveforms at principal portions of the horizontal deflection circuit shown in FIG. 8.

FIG. 7 shows waveforms of major voltages and major currents in the circuit of FIG. 6.

In FIG. 7, solid lines represent waveforms of when the horizontal raster has a large size, and dotted lines represent waveforms of when the horizontal raster has a small size. FIGS. 7(c) and 7(d) show waveforms of current $i_B'$ and $i_{CP}'$ of when the transistor 16 is not used, and FIGS. 7(e) and 7(f) show waveforms of current $i_B'$ and $i_{CP}'$ of when the transistor 16 is used.

Using the diode modulator of FIG. 6, the amplitude of the horizontal deflection current $i_{DY}'$ increases when the size of the horizontal raster is increased and decreases when the size of the horizontal raster is decreased.

As shown in FIG. 7(a), however, the amplitude of the collector voltage $v_{CP}'$ of the horizontal output transistor 4 remains nearly the same irrespective of a change in the amplitude of the horizontal deflection current $i_{DY}'$.

Without using the transistor 16, the base-collector current $i_{BC}'$ increases when the horizontal deflection current $i_{DY}'$ has a small amplitude (i.e., when the size of the horizontal raster is small) as shown in FIGS. 7(c) and 7(d). This is because the modulation current $i_M$ that flows into the modulation coil 21 increases with the decrease in the amplitude of the horizontal deflection current $i_{DY}'$, and whereby both the base-collector current $i_{BC}'$ and the damper current $i_D'$ increase.

When the transistor 16 is used, on the other hand, the current is prevented by the transistor 16 from flowing from the emitter of the horizontal output transistor 4 to the drive transformer 3 in the drive circuit 101 via the resistor 17 that regulates the base current during the period in which the horizontal output transistor 4 is nonconductive, and hence the flow of the base-collector current $i_{BC}'$ is blocked.

Even when the amplitude of the horizontal deflection current $i_{DY}'$ is decreased to decrease the size of the horizontal raster, therefore, no adverse effect (i.e., increased loss in the horizontal output transistor 4) results from an increase in the base-collector current $i_{BC}'$. According to this embodiment as described, the use of the transistor 16 solves the problems involved in the diode modulator.

Therefore, the present invention can be particularly effectively adapted to a horizontal deflection circuit which uses the diode modulator as the horizontal deflection output circuit 100 as in this embodiment.

In the horizontal deflection circuit, in general, the optimum drive condition of the horizontal output transistor 4 changes when the size of the horizontal raster is changed by changing the amplitude of the horizontal deflection current $i_{DY}'$. When the amplitude of the horizontal deflection current $i_{DY}'$ is small in this embodiment, therefore, it is necessary to decrease the absolute values of forward base current $i_{B1}'$ and reverse base current $i_{B2}'$ as shown in FIGS. 7(c) and 7(e) in order to suppress the loss in the horizontal output transistor 4.

Figure 8:
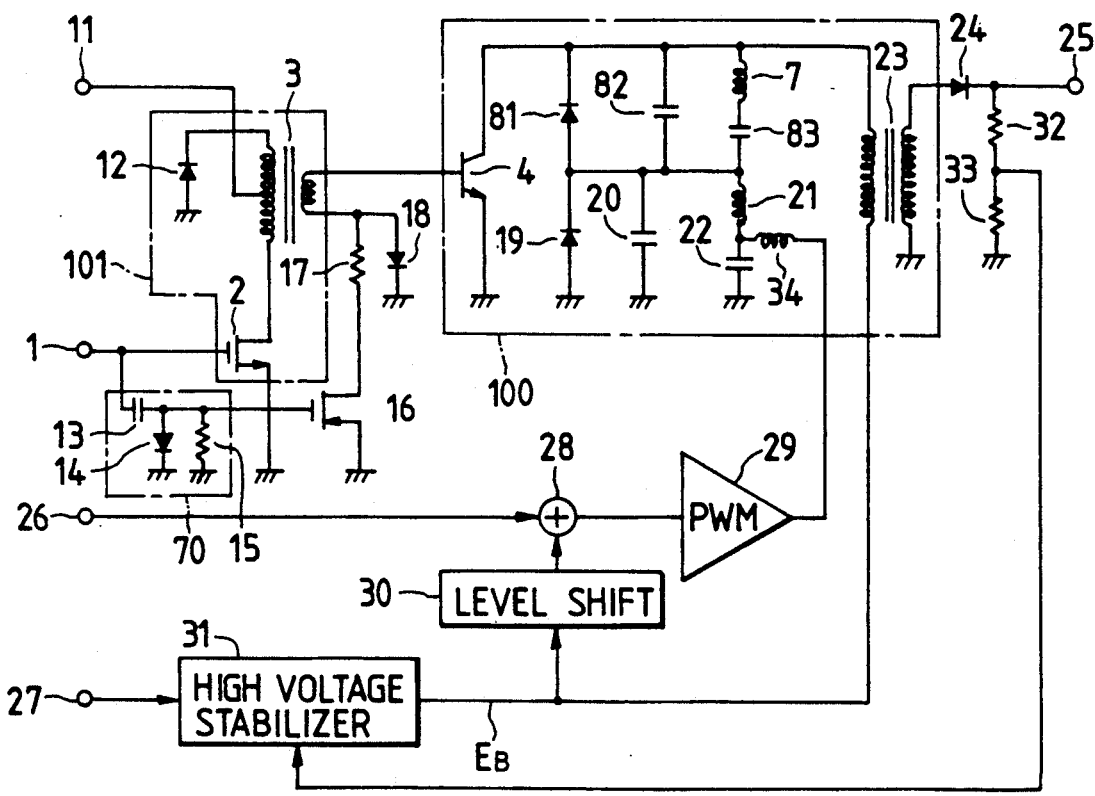

FIG. 8 is a circuit diagram which illustrates a fifth embodiment of the present invention.

In FIG. 8, reference numeral 28 denotes an adder circuit, 29 denotes a pulse-width modulation circuit, 30 denotes a level shifter, 31 denotes a high voltage stabilizer, 32 and 33 denote resistors, and 34 denotes a choke coil. The above-mentioned components that are newly added makes this embodiment different from the fourth embodiment of FIG. 6.

In this embodiment, the high voltage stabilizer 31 controls the power source voltage $E_B$ that is input to the fly-back transformer 23 such that a high voltage detected by the resistors 32 and 33 becomes constant.

At this moment, the fluctuating component $\Delta E_B$ in the power source voltage $E_B$ is input to the adder circuit 28 via the level shifter 30 and is superposed on the parabolic wave signals of a vertical scan period input through the vertical parabolic wave input terminal 26.

The output of the adder circuit 28 is applied, via pulse-width modulation circuit 29 and choke coil 34, to the point where the second trace capacitor 22 and the modulation coil 21 are connected (or to the point where the first trace capacitor 83 and the modulation coil 21 are connected as shown in FIG. 6).

With the fluctuating component $\Delta E_B$ of the power source voltage $E_B$ being superposed on the parabolic wave signals of the vertical scan period as described above, it is allowed to correct variation in the horizontal raster size (i.e., variation in the amplitude of the horizontal deflection current) that is caused by a change in the power source voltage $E_B$.

Here, the amplifier circuit 50 shown in FIG. 7 may be used instead of the pulse-width modulation circuit 29 (however, loss can be further decreased when the pulse-width modulation circuit 29 is used).

In addition to the effects of the fourth embodiment, this embodiment provides image of high quality with small variation in the high voltage and small change in the horizontal raster size.

When the horizontal deflection circuit is to be practically fabricated according to the aforementioned embodiments, it is important to form thick and short wirings among the drive circuit 101 constituted by the drive transformer 3 and the like, the first switching means 18', the second switching means 16', and the horizontal output transistor 4, and to form a thick and short pattern on the substrate (inclusive of wiring of ground (GND) and substrate pattern), from the standpoint of decreasing the impedance and decreasing the loss.

We claim:
1. A horizontal deflection circuit comprising:
a horizontal deflection coil through which a horizontal deflection current periodically flows;
a semiconductor switching element through which the horizontal deflection current selectively flows to the horizontal deflection coil, the semiconductor switching element having a control terminal;
a drive circuit for generating a drive current having first and second periods that are alternatingly repeated with a horizontal deflection frequency, the drive circuit having first and second input/output ends; and,
a drive current path disposed between the drive circuit and ground for supplying the drive current from the drive circuit to the control terminal, the drive current path including:
a diode element,
an other switching element connected in parallel with the diode element,
the parallel connected diode and the other switching element being connected in series with the drive circuit and the control terminal such that (i) a reverse bias is applied to the control terminal of the semiconductor switching element through the diode during the drive current first period and (ii) a forward bias is applied to the control terminal through the other switching element during the drive current second period,
wherein the first input/output end of the drive circuit is connected to the control terminal of the semiconductor switching element, and the parallel connected diode and the other switching element are connected between the second input/output end of the drive circuit and ground.
2. A horizontal deflection circuit comprising:
a horizontal deflection coil through which a horizontal deflection current periodically flows;
a semiconductor switching element through which the horizontal deflection current selectively flows to the horizontal deflection coil, the semiconductor switching element having a control terminal;
a drive circuit for generating a drive current having first and second periods that are alternatingly repeated with a horizontal deflection frequency, the drive circuit having first and second input/output ends; and,
a drive current path disposed between the drive circuit and the semiconductor switching element control terminal for supplying the drive current from the drive circuit to the control terminal, the drive current path including:
a diode element, an other switching element connected in parallel with the diode element, the parallel connected diode and the other switching element being connected in series with the drive circuit and the control terminal such that (i) a reverse bias is applied to the control terminal of the semiconductor switching element through the diode during the drive current first period and (ii) a forward bias is applied to the control terminal through the other switching element during the drive current second period, wherein the parallel connected diode and the other switching element are connected in parallel between a first input/output end of the drive circuit and the control terminal, and the second input/output end of the drive circuit is connected with ground.

3. A horizontal deflection circuit comprising:

a horizontal deflection coil through which a horizontal deflection current periodically flows;

a semiconductor switching element through which the horizontal deflection current selectively flows to the horizontal deflection coil, the semiconductor switching element having a control terminal;

a drive circuit for generating a drive current having first and second periods that are alternatingly repeated with a horizontal deflection frequency;

a drive current path defined between the drive circuit and the semiconductor switching element control terminal for supplying the drive current from the drive circuit to the control terminal, the drive current path including:

a diode element, an other switching element connected in parallel with the diode element, the parallel connected diode and the other switching element being connected with the drive circuit and the control terminal such that (i) a reverse bias is applied to the control terminal of the semiconductor switching element through the diode during the drive current first period and (ii) a forward bias is applied to the control terminal through the other switching element during the drive current second period;

said drive circuit including:

a current source for generating intermittent current pulses corresponding to the first and second periods, and a drive transformer for transforming the intermittent current pulses into the drive current, the drive transformer having a primary winding through which the intermittent current pulses of the current source flow and a secondary winding connected with the drive current path for supplying the drive current to the drive current path, wherein said current source includes:

a drive transistor for driving the drive transformer, the other switching element comprises a switching transistor, and a connection means for connecting a base of the drive transistor to a base of the switching transistor.

4. A horizontal deflection circuit according to claim 3, wherein said connection means consists of a level shifter.

5. A horizontal deflection circuit comprising:

a drive circuit for generating a horizontal deflection drive signal which alternates cyclically between a high level and a low level during first and second periods, respectively, with a horizontal deflection frequency, the drive circuit having an output on which the horizontal deflection drive is provided;

a horizontal deflection output circuit including:

a horizontal deflection coil, a damper diode connected in parallel with the horizontal deflection coil, a horizontal output switching element having a control terminal and being operatively connected with the horizontal deflection coil for selectively passing the horizontal deflection drive signal thereto;

a horizontal deflection signal path for connecting the drive circuit output and the horizontal output switching element control terminal for supplying the horizontal deflection signal thereto, the horizontal deflection path including:

a diode element, an other switching element connected in parallel with the diode element, the parallel connected diode and the other switching elements being connected in parallel between the drive circuit and one of the control terminal and ground such that the control terminal, the horizontal deflection path, the drive circuit and ground are connected in series.

* * * * *